United States Patent
Cook et al.

[19]

[11] Patent Number: 6,104,475
[45] Date of Patent: Aug. 15, 2000

[54] PLATESETTER

[75] Inventors: Paul Christopher Cook, Gloucester; Alan Dresch, Worcestershire; Stephen Clifford Smith; Peter John Neilson, both of Gloucestershire, all of United Kingdom

[73] Assignee: ICG Limited, Gloucestershire, United Kingdom

[21] Appl. No.: 08/913,625

[22] PCT Filed: Apr. 4, 1996

[86] PCT No.: PCT/GB96/00841

§ 371 Date: Jan. 14, 1998

§ 102(e) Date: Jan. 14, 1998

[87] PCT Pub. No.: WO96/31807

PCT Pub. Date: Oct. 10, 1996

[30] Foreign Application Priority Data

Apr. 6, 1995 [GB] United Kingdom ................... 9507140

[51] Int. Cl.[7] ............................. G03B 27/10; H04N 1/04
[52] U.S. Cl. ............................................. 355/84; 358/494
[58] Field of Search ................................. 355/81, 82, 84, 355/27, 40, 74–75; 358/474, 296, 497, 483, 496, 498, 494; 399/211, 362, 371

[56] References Cited

U.S. PATENT DOCUMENTS

| | | | |
|---|---|---|---|
| 4,368,413 | 1/1983 | Tazaki | 318/687 |
| 4,739,415 | 4/1988 | Toyono et al. | 358/296 |
| 4,920,422 | 4/1990 | Lapierre | 358/296 |
| 4,937,678 | 6/1990 | Murai et al. | 358/296 |
| 5,038,208 | 8/1991 | Ichikawa et al. | 358/75 |
| 5,049,999 | 9/1991 | Stemmle | 358/296 |
| 5,291,464 | 3/1994 | Osada | 369/32 |
| 5,905,581 | 5/1999 | Suzuki et al. | 358/468 |

*Primary Examiner*—Safet Metjahic
*Assistant Examiner*—Hung Henry Nguyen
*Attorney, Agent, or Firm*—Baker Botts, L.L.P.

[57] ABSTRACT

Apparatus for scanning a light-beam across a sheet mounted on a flat bed, the apparatus including a bridge that extends across the bed from one side to the other and is supported at each end on carriage guided along a respective one of said sides of the bed, a scanning head that is su ported on the bridge, drive devices at each end of the bridge to drive a respective carriage, location devices at each end of the bridge to monitor the position of each carriage along a respective one of said sides, and control device to control operation of each drive devices in accordance with information of the position of the respective carriage driven by the drive devices, determined by the respective location devices, so that both ends of the bridge are moved simultaneously in timed relation to one another.

22 Claims, 6 Drawing Sheets

PLATESETTER

BACKGROUND OF THE INVENTION

1. Field of the Invention

This invention relates to apparatus for scanning a modulated light-beam across a photosensitive surface, and especially apparatus commonly known as platesetters, in which an image is scanned directly onto the photosensitive surface of a printing plate.

2. Description of the Background

The plates used in platesetters are generally made of aluminium sheet and are supplied in different sizes to suit different size printing jobs. In use, each plate is mounted on a scanning bed of the platesetter, which is typically a fixed concave bed to suit the curved focal plane of a particular rotary mirror, light-beam scanning system. The aluminium plates are thin enough to be flexible so as to conform to the concave shape of the bed, and are held in position by mechanical fastenings and/or pneumatic suction means.

The quality of the print image produced is principally dependent upon the accuracy of the light-beam scanning system, and this is why curved bed platesetters have been preferred. The productivity of a platesetter is dependent upon the speed of operation of the scanning system. However, the time taken in loading and removing plates from the bed also has a major effect on productivity and also effects quality adversely if the plates are not secured adequately, especially at the edges where their natural resilience can cause them to lift away from the bed.

SUMMARY OF THE INVENTION

An object of the present invention is to provide an improved platesetter, in particular, a platesetter with an improved plate handling system. Another object is to provide a platesetter which is adapted to serve the alternative function of scanning a modulated light-beam across a photosensitive film which is used in a separate process to produce a printing plate.

According to a first aspect, the invention consists in a platesetter having a flat bed, a light-beam scanning system mounted above the bed so as to scan a photosensitive plate on the bed, a store for photosensitive plates located beneath the bed, and feed means for feeding photosensitive plates from the store to the bed for scanning.

Preferably, the plates are stored upright in one or more cassettes beneath the bed, and the feed means selects plates as required from the cassettes and feeds each to a feed station along one side of the bed, from where the plate is fed horizontally onto the bed, preferably edge first with the leading edge generally normal to the feed direction.

It will be appreciated that by locating the plate store beneath the bed, a compact and convenient arrangement is achieved which readily facilitates loading of plates into the store from one side of the apparatus extending generally parallel to the feed direction.

According to a second aspect, the invention consists in a printsetter having a flat bed, a light-beam scanning system mounted to scan a photosensitive plate on the bed, a plate feed station located along a first side of the bed to feed photosensitive plates one at a time onto the bed in a first feed direction, and a film feed station located along a second side of the bed adjacent said first side to feed photosensitive film sheet onto the bed in a second feed direction transversely of sad first feed direction.

Preferably, the plates are stored upright in cassettes beneath the bed, and feed means selects plates and feeds them to the feed station. The cassettes are loaded beneath the bed along the same side as the film feed station so that the handling of the photosensitive media conveniently takes place in a common work area which may be incorporated in a "darkroom".

Preferably, the plates and film sheet are removed from the bed in said second feed direction so that they can be further handled or processed in the same work area.

According to a third aspect, the invention consists in apparatus for scanning a modulated light-beam across a photosensitive sheet, such as a photosensitive printing plate, comprising a flat bed to support said sheet, a light-beam scanning system to scan a photosensitive sheet mounted on said bed, and sheet location means comprising air ducts adapted to supply a layer of air to the bed on which the sheet can "float", and one or more stop members located on the bed in relation to an inclination of the bed from the horizontal so that a sheet "floating" on the bed slides under the action of gravitational force against the stop. Preferably, stop members are located to support adjacent lowest edges of said sheet so that it is located in mutually orthogonal directions on said bed.

This arrangement of pneumat ic support and gravitational self-location of a sheet is simple to provide, and is rapid and effective in operation, especially with photosensitive printing plates that are relatively rigid and weighty.

According to a fourth aspect, the invention consists in apparatus for scanning a modulated light-beam across a photosensitive sheet comprising a flat bed to support said sheet, a light-beam scanning system including a scanning head mounted above the bed so as to scan a sheet on the bed, and sheet pick-up means, such as pneumatic suction means, mounted on the head to contact the upper surface of the sheet and hold it so that it can be moved by the head to be located in position on the bed for subsequent scanning.

The dual use of the scanning head for light beam scanning and sheet location serves to simplify the design of the apparatus.

If necessary, the aforesaid pneumatic support and gravitational self-location arrangement for a sheet can be used in combination with the scanning head sheet pick-up means so as to achieve final location of a sheet once released by the pick-up means onto the bed. For example. different size sheets may each require to be located differently in relation to the stop members by the scanning head pick-up means.

According to a fifth aspect the invention consists in apparatus for scanning a light-beam across a sheet mounted on a flat bed, the apparatus comprising a bridge that extends across the bed from one side to the other and is supported at each end on a carriage guided along a respective one of said sides of the bed, a scanning head that is supported on the bridge, drive means at each end of the bridge to drive a respective carriage, location means at each end of the bridge to monitor the position of each carriage along a respective one of said sides, and control means to control operation of each drive means in accordance with information of the position of the respective carriage driven by the drive means, as determined by the respective location means, so that both ends of the bridge are moved simultaneously in timed relation to one another. By these means, the bridge can be maintained orthogonal to the axis along which it is scanned across the bed, while the scanning head is moved the length of the bridge so as to scan the bed along a second axis perpendicular to said first axis.

The drive means preferably comprise electric linear motors.

Preferably, the ends of the bridge are pivotally connected to the carriages so as to accommodate slight differential movements of the carriages without impairing the movement of either carriage along said sides. The location means, preferably takes the form of an optical grating along each side and is positioned as close as possible to these pivotal connections to minimise tilting errors in the carriage position measurements.

Preferably, the centre of gravity of the scanning head is aligned with the respective pivotal connections at the ends of the bridge so that acceleration of the scanning head does not apply a torque to the bridge that would adversely effect the positions of the carriages at each end.

Preferably, drive means, such as an electric linear motor, and location means, such as an optical grating, are provided on the bridge to control longitudinal movement of the scanning head along the bridge.

The scanning head preferably scans the light-beam repeatedly across a short distance and is advanced between individual scans so that successive lines are scanned across the direction of advance of the scanning head along the bridge, the light-beam thereby covering a band or swathe in a single traverse across a sheet being scanned. Successive traverses of the scanning head are offset each by the width of a swathe from the last swathe as the bridge is indexed across the bed so th t the whole of the sheet is scanned by the head.

According to a sixth aspect, the invention consists in a scanning system in which a scanning head is located along a scanning axis by a location system comprising an optical sensor and a grating which move relative to one another, the sensor producing sine and cosine voltage output signals corresponding to the spacing of lines ruled at regular intervals along the grating, the system further comprising a processor that processes these signals to compensate for variations in the distance between the sensor and the grating, the processor serving to determine the instantaneous value of the root of the sum of the squares of the output signals, and divide each of the output signals by this root-mean-square value before processing the output signals to determine the position of the scanning head.

According to a seventh aspect, the invention consists of an apparatus for scanning a modulated light-beam across a photosensitive sheet comprising a flat bed to support said sheet, a light-beam scanning system including a scanning head mounted above the bed so as to scan a sheet on the bed, and sheet pick-up means mounted on the head to contact the upper surface of the sheet and hold it so that it can be moved by the head to be located in position on the bed for subsequent scanning.

BRIEF DESCRIPTION OF THE DRAWINGS

The invention will now be described by way of example with reference to the accompanying drawings in which.

DETAILED DESCRIPTION OF ILLUSTRATIVE EMBODIMENTS

Figure 1:
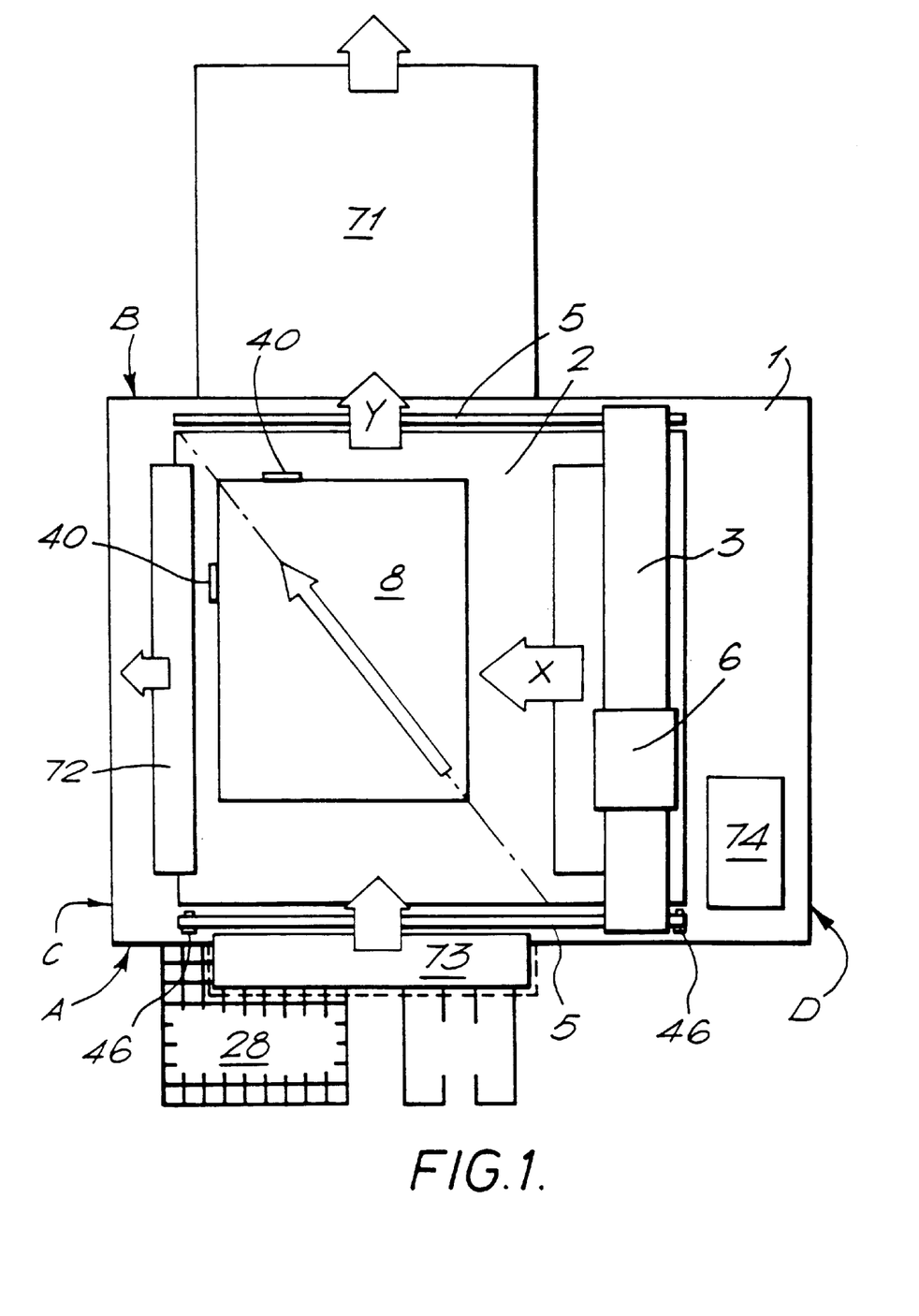
FIG. 1 shows a schematic plan view of a platesetter according to the invention.

The illustrated platesetter consists of a rectangular frame 1 which has four upright sides A,B,C,D and supports a float rectangular bed 2 at its top to receive photosensitive sheet material to be scanned. A light-beam scanning mechanism is also supported on top of the frame 1, and consists of a scanning bridge 3 that extends over the bed 2 from one side A to the other side B and is supported at each end on a carriage 4 that runs on a guide 5 along a respective side A,B of the bed. The bridge 3 is therefore guided on these parallel guides 5 so as to traverse the be 2 on a line X parallel to the guides. A scanning head 6 is mounted on the bridge 3 and is guided along the length of the bridge so as to scan the bed along a line Y substantial parallel to the sides C and D and perpendicular to the line of movement X of the bridge. A laser light-beam source 7 is mounted on the head 6 and is directed at the bed so that it can be scanned across a sheet of photosensitive material on the bed by controlled movements of the head and bridge along their respective orthogonal lines of movement X and Y.

The photosensitive sheet material may take the form of rectangular flexible aluminium plates 8 which when exposed and processed form a printing plate. These plates are stored upright in a store 9 beneath the bed with a plate feed mechanism 10 that feeds plates one at a time as required, onto the bed through a feed slot 11 along one side D of the bed beneath the bridge start position. Each plate fed through the slot 11 moves along the line of movement X of the bridge with its leading edge extending generally parallel to the bridge and sides C and D.

Figure 2:
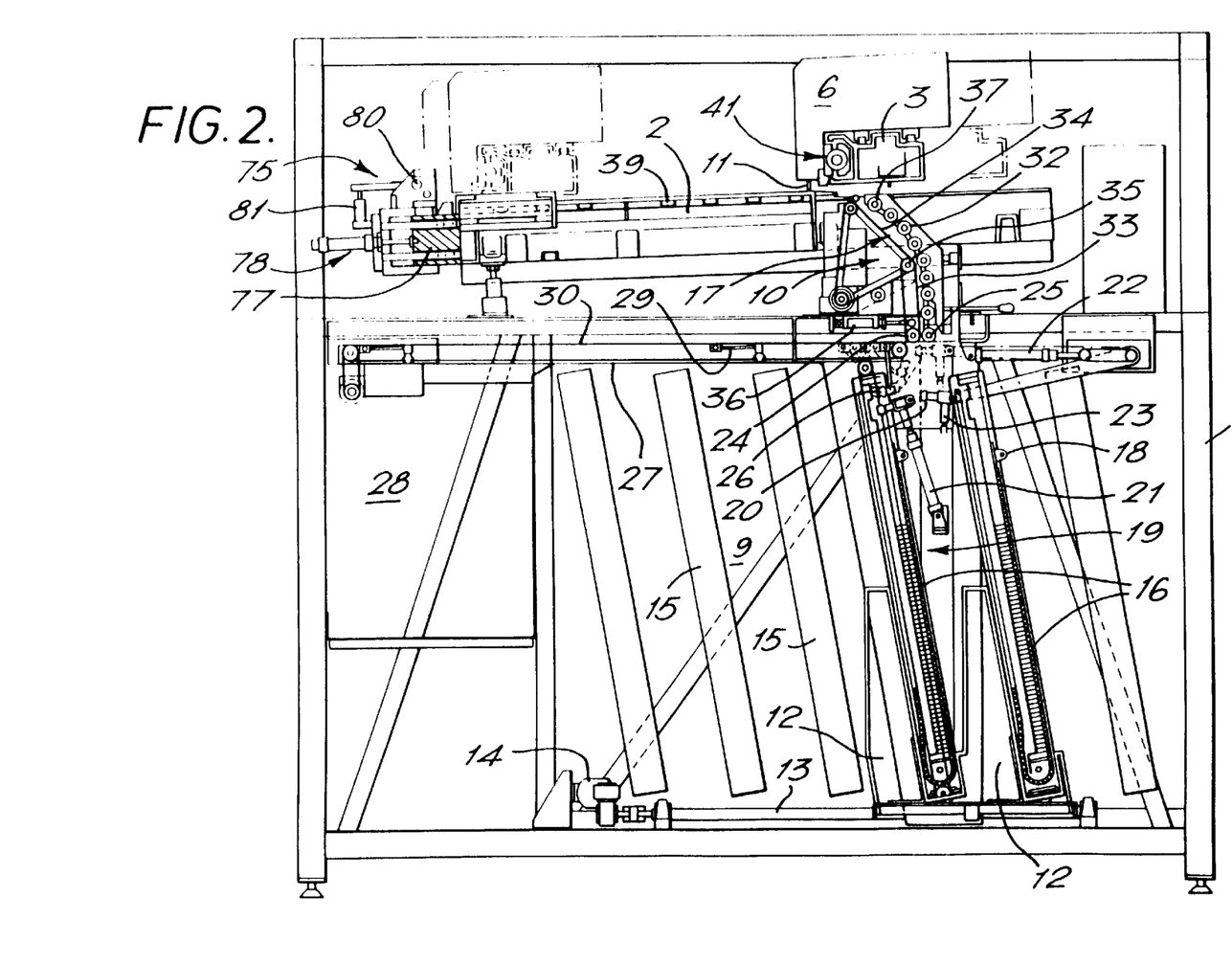
FIG. 2 shows a side elevation of the side A of the platesetter of FIG. 1.

The store 9 consists of a set of cassette holders 12 that extend between the sides A,B and are supported together on a lower mobile frame 13 that is moveable by a drive mechanism 14 along a line between the two sides C,D. Each cassette holder 12 is adapted to support an upright cassette 15 in which plates 8 of a particular size are stored. These cassettes 15 are loaded into the holders 12 from the side A. A roller shutter door 16 closes the front of each cassette that faces the side D, and has to be rolled downwards to open the cassette for removal of a plate.

A plate 8 of a particular size is selected for feeding to the bed 2 by moving the mobile frame 13 with the drive mechanism 14 until the cassette containing the required plate is located in a feed position beneath a belt feed mechanism 17. A door opening mechanism (not shown) then engages lugs 18 on the door 16 of the cassette to roll it downwards. A plate gripping mechanism 19 consisting of a set of pneumatic suction pads 20, operates under the control of a pair of fluid actuated rams 21,22 at each end of a lateral support 23 carrying the suction pads 20, so that the pads 20 are moved downwards in front of the cassette to engage the face of the forward-most plate within the cassette 15. Suction causes the pads 20 to grip the plate 8 so that it is tilted forwards at the top out of the cassette 15 as the horizontal rams 22 move the pads 20 forwards. The vertical rams 21 then lift the whole plate 8 so as to feed its upper edge into the pinch between a fluid actuated pinch roller 24 and a lower roller 25 of the belt feed 17. Once gripped by the pinch roller 24, the suction applied to the pads 20 is released and the belt feed 17 operates to feed the plate onto the bed 2.

A further set of suction pads 26 operate in synchronism with the suction pads 20 and serve to grip a protective sheet interleaved between plates 8 in the cassette, and removes this horizontally across a cover 27 over the cassettes 15 towards side C, where it is deposited in a waste bin 28. The pads 26 are mounted at the end of individual fingers 29 which are pivotally connected to a closed loop drive mechanism 30 extending over the cover 27 and serving to move the fingers 29 between the belt conveyor 17 and bin 27 and back again along a set feed path. At that end of the feed path adjacent to the belt conveyor 17, the fingers 29 pivot downwards so that the suction pads 26 at their ends engage the protective sheet in the cassette. Continued operation of the drive mechanism 30 then serves to withdraw the fingers 29 from the cassette as they make a return movement along the feed path.

Figure 3:
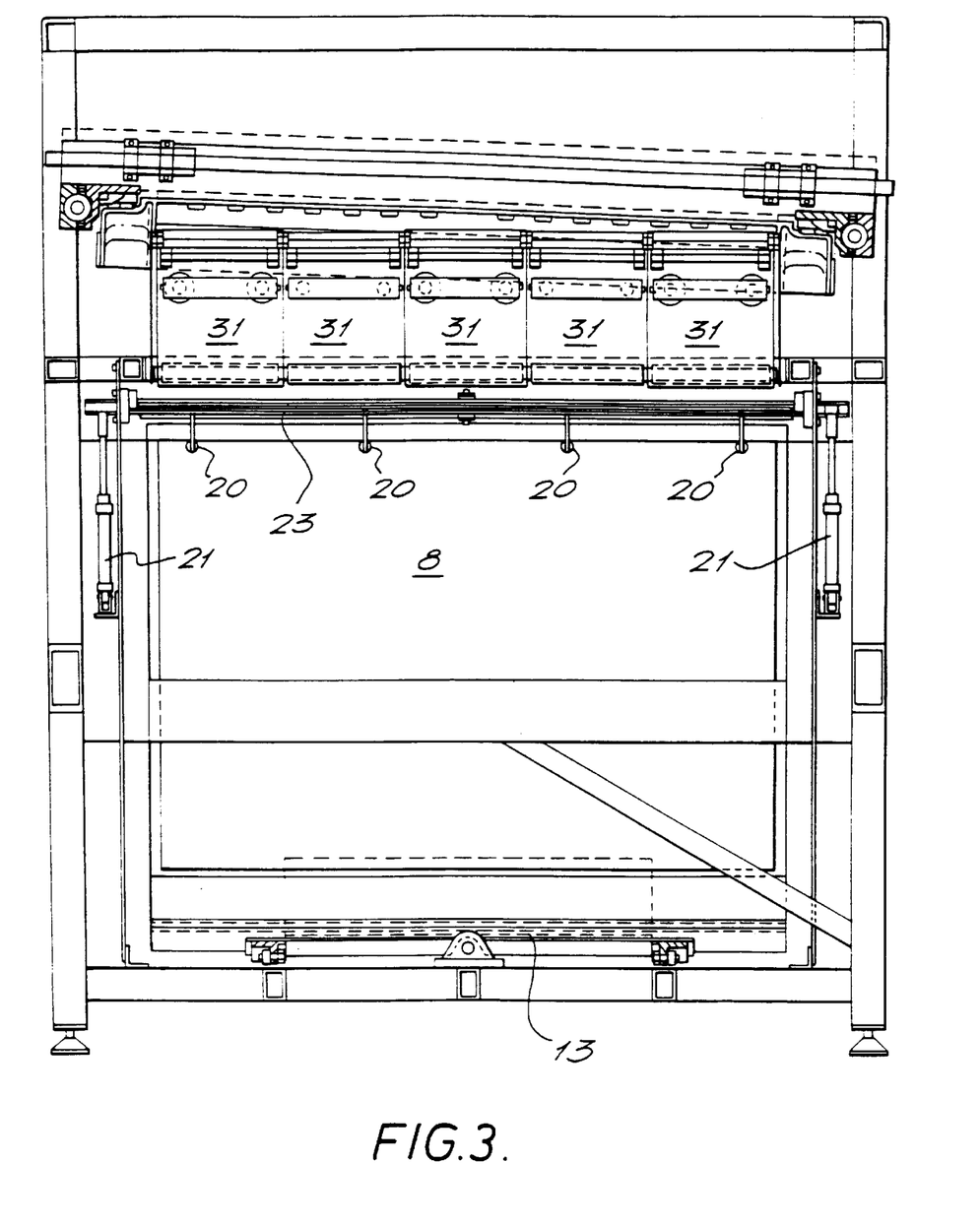
FIG. 3 shows a side elevation of the side D of the platesetter of FIG. 1.

The belt conveyor 17 consists of a continuous belt feed 31 and a set of feed rollers 32 which grip and feed each plate 8 between them. The belt feed 31 consists of an infeed belt 33 and an outfeed belt 34, both linked together on a common intermediate roller 35. The infeed belt runs over the pinch roller 24 at the input end, and the outfeed belt 34 is driven by a motor 36 which in turn drives the infeed belt 33 via the intermediate roller 35. The feed rollers 32 are spaced along an arcuate feed path from the lower roller 25 to an upper roller 37 so that plates 8 follow this path as they are fed by the belts 31,33 and exit at the upper end on a tangential path towards the feed slot 11 formed between the edge of the bed 2 and the bridge 3. As shown in FIG. 3, five similar belt feed units 31 are aligned horizontally across the frame between the sides A and B, but a single central belt feed unit 31 could be used in an alternative embodiment.

The flexibility of each plate 8 allows it to flex as it is fed between the belts 33,34 and rollers 35 but it is still stiff enough to extend unsupported from the belt feed unit 31 through the feed slot 11. Once the belt feed unit 31 has delivered the plate fully, the leading section lies on the bed 2, but the trailing section still extends rearwards through the feed slot 11 beneath the bridge 3. A pair of pneumatic suction pads 38 on the underside of the scanning head 6 then serve to grip the plate 8 so that movement of the head can be used to deliver the plate 8 to an initial delivery location on the bed 2, with adjacent edges of the plate generally parallel to the sides B and C.

Final location of the plate 8 on the bed 2 is achieved by floating the plate on a cushion of air produced by air delivery ducts 39 distributed across the upper face of the bed. The bed 2 is inclined slightly from the horizontal along both lines X and Y, the bed being lower along the sides B and C so that the plate floats under the effect of gravity towards these sides B and C and engages respective stops 40 along these sides. The air supply to the ducts 39 is then switched off, and suction applied so as to grip the plate 8 and hold it in this final location for scanning.

Movement of the bridge 3 across the bed 2 in the X direction is effected by drive means at each end which acts through the carriage 4 on which the end of the bridge is supported. The drive means comprises an electric linear motor 41, shown in more detail in FIGS. 4 and 5, which comprises an annular winding 42 clamped by a bracket 43 to an outer upright flange 44 of the carriage 4, and a magnetic rod 45 that extends through the centre of the winding 42 along a respective side A,B of the bed, and is secured to the frame by brackets 46 at each. Energisation of the winding 42 produces an axial force on the winding in the normal manner of a linear motor, and causes the carriage to move along the guide 5.

Figure 4:
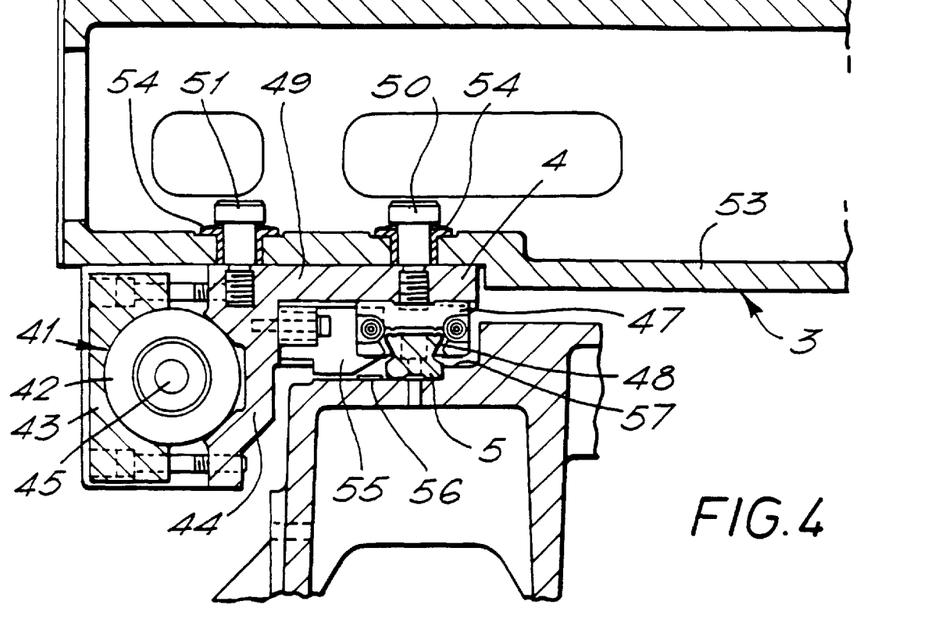
FIG. 4 shows a detail of one end of the scanning bridge from FIG. 3.
Figure 5:
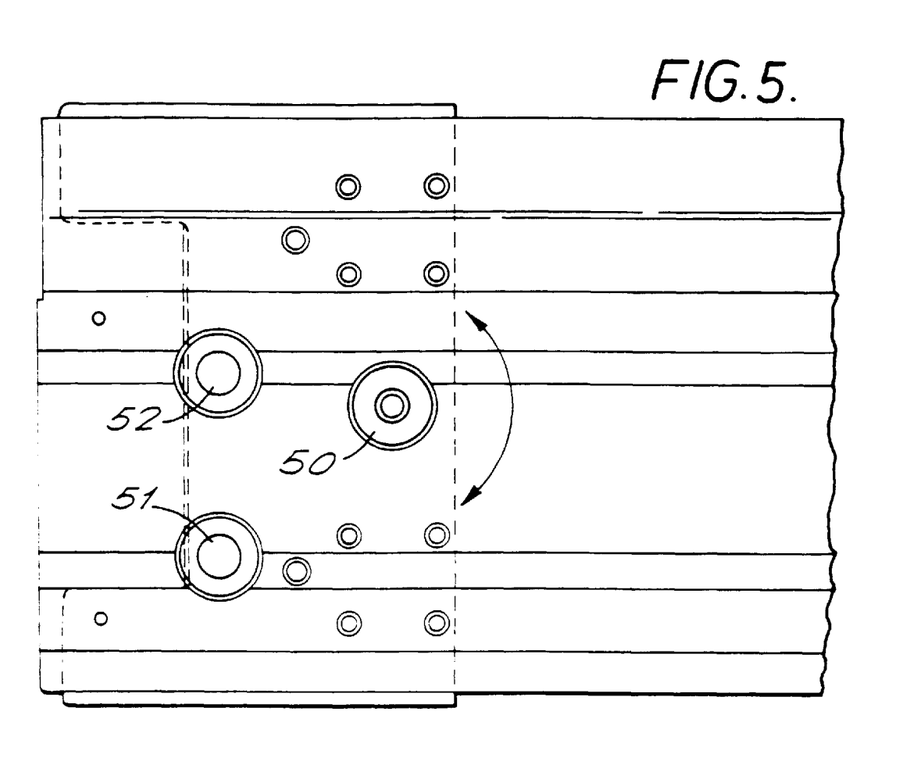
FIG. 5 shows a plan view of that end of the scanning bridge shown in FIG. 3.

A slide 47 connects the carriage 4 to the guide 5 and consists of a re-circulating ball-bearing type slide having a C-shaped cross-section to match the cross-section of the guide, which has retaining channels 48 along each side. The slide 47 is connected to the underside of a horizontal flange 49 of the carriage which projects inwards from the outer upright flange 44. The bridge 3 is connected to the upper surface of the flange 49 by three shoulder bolts 50,51,52 which extend down wards through holes in a lower wall 53 of the bridge and are threaded into the flange 49. Each bolt is provided with a bush 54 within the hole in the wall 53 so that the bolts secure the bridge and carriage together vertically without applying a load to the interface between these components. This is arranged in order to allow a limited pivoting movement of the bridge 3 about one of the bolts 51. The bush 54 around this bolt 51 is rigid and serves as an annular bearing. However, the bushes 54 around the other two bolts 52,53 are resilient so that they will accommodate the required limited pivoting movement of the bridge. The pivot bolt 51 is aligned vertically with the centre-line of the guide 5, and the other bolts 52,53 are located outboard of the bolt 51.

The limited pivotal movement of each end of the bridge 3 on the respective carriages 4 is provided to allow each end of the bridge 3 to be moved independently by the respective linear motors 41 so that the bridge can be positively maintained orthogonal to the line of movement X (i.e. aligned on the line Y).

Control of the position of each end of the bridge 3 is effected by an optical sensor 55 on the carriage 4 which scans an optical grating 56 that extends along a respective side A,B of the bed 2. The sensor 55 is a known type of encoder which works with a grating 56 to produce analogue sine and cosine output voltages at a pitch corresponding to the pitch of the lines ruled on the grating, typically 20 microns. A scanning control system receives these analogue signals and processes them into digital form to determine the approximate position of the carriage in terms of the zero cross over points, which occur at intervals of 5 microns with a 20 microns grating pitch. Furthermore, the control system also incorporates analogue servo-control in which the amplitude of the output voltage signals from the encoder 55 can be used to determine the final position of the bridge to a higher accuracy.

As shown in FIG. 4, the encoder 55 is fixed to the underside of the carriage 4 in the angle between the flanges 44,49, and the grating 56 is attached to the adjacent surface 57 of a rebated edge of the bed 2 to which the guide 5 is also connected. The grating 56 is located outboard of the guide 5, but close to it so that the position reading given by the encoder and grating corresponds as closely as possible to the position of the pivotal connection 51 of the bridge to the carriage.

The accuracy of the position readings given by the encoder and grating is dependent upon the amplitude of the sine and cosine output signals from the encoder 55, and these are therefore sensitive to variations in the Spacing of the encoder 55 from the grating 56 as the two move relative to one another. Typically, such variations can cause the outputs from the encoder to vary by a factor of 4. In order to counteract such effects, the output signals are subject to compensation processing be fore they are used to determine a position. This compensation process makes use of the trigonometric identity:

$$\sin^2 + \cos^2 = 1$$

Assuming that the sine and cosine signals from the encoder are subject to a spacing error factor k, this factor k can be determined by root-mean-square processing using a standard log-antilog circuit after the signals have been rectified. That is:

$$[(k \sin e)^2 + (k \cos)^2]^{1/2} = k(\sin e^2 + \cos^2)^{1/2} = k$$

The sine and cosine output signals are then divided by the factor k to produce compensated outputs for position measurement.

Figure 6:
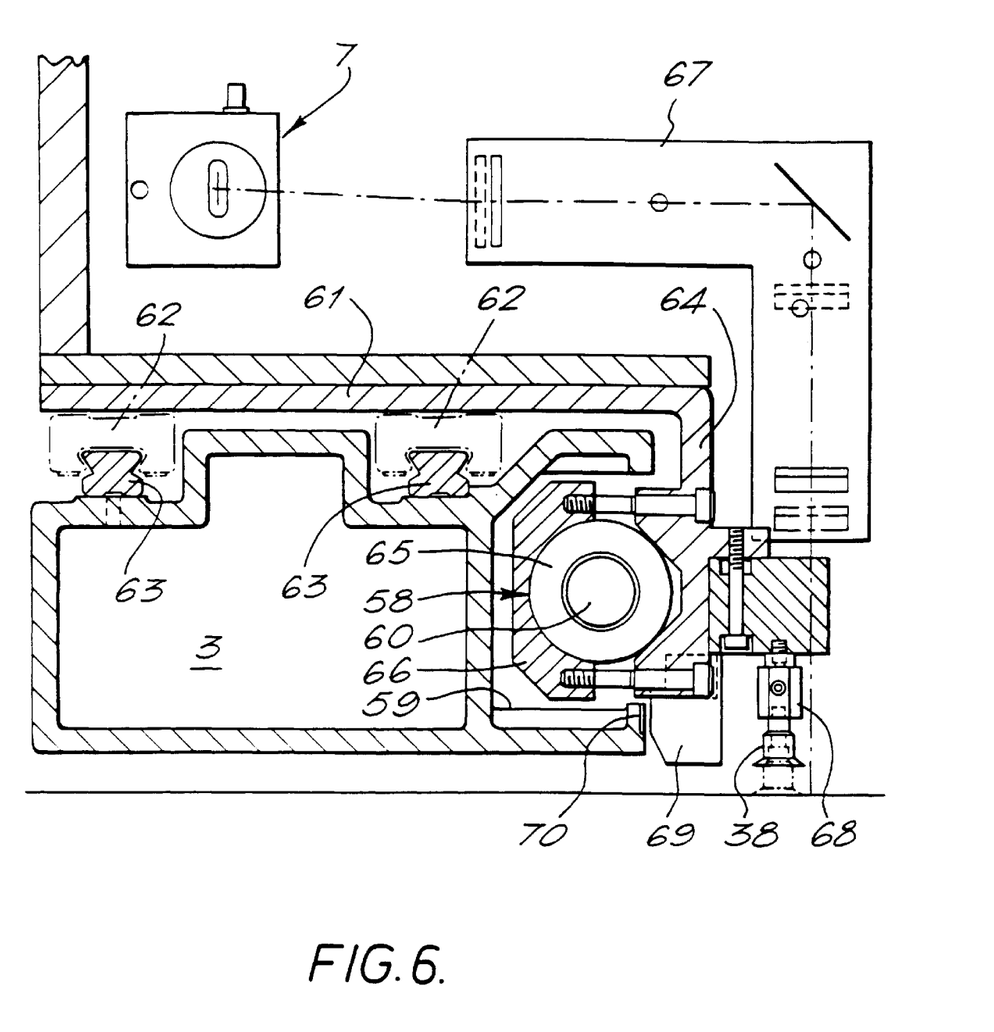
FIG. 6 shows a section through the scanning head shown in FIG. 1.

Movement of the scanning head 6 along the bridge 3 is also effected by an electric linear motor 58, which is shown in cross-section in FIG. 6. The bridge 3 is a box-section member and is formed with al open recess 59 along one side in which is mounted a magnetic rod 60 so as to extend the length of the recess. The head 6 consists of a horizontal platform 61 mounted via a pair of slides 62 on a pair of guides 63 extending the length of the bridge, these slides 62 and guides 63 being similar to the equivalent components 47 and 5 used with the carriages 4. A flange 64 extends downwards from the platform 61 alongside the opening of the recess 59, and an annular winding 65 is clamped to the inside face of the flange 64 by a bracket 66, and extends into the recess 59 and surrounds the magnetic rod 60. The winding 65 and rod 60 together constitute the linear motor 58 that moves the platform along the bridge 3 in the Y direction across the bed 2.

Control of the position of the scanning head 6 along the bridge is effected by an optical sensor 69 mounted at the lower end of the flange 64 so as to scan an optical grating 70 on the adjacent side of the bridge 3. The sensor 69 and grating 70 are similar to the equivalent components 55 and 56 that control the position of the bridge 3 in the X direction, as described above, and together they produce outer t signals that control the linear motor 58 so as to position the head 6 to 5 micron intervals along the bridge corresponding to the line spacing of the grating.

The laser light-beam source 7 is mounted on top of the platform 61 together with a lens system 67 that directs a laser beam downwards alongside the flange 64 onto the bed.

The suction pads 38 on the head that pick-up plates on the bed, as described above, are mounted on the outside of he flange 64 via respective rams 68, which serve to raise and lower the pads 38 as necessary.

The lens system 67 includes canning means that scans the beam across a predetermined short width of the bed 2 along the line X so that a band or swathe is scanned by the beam as it is indexed along the bridge and makes successive scans at intervals of 5 microns. Thus, a plate 8 located on the bed 2 is scanned in successive swathes across it in the Y direction.

Once a plate 8 has been scanned to expose it and form a print image thereon, it is removed from the bed by a pick-up mechanism 71 along the side B which moves over the bed, picks-up the plate 8 by pneumatic suction and removes the plate along the line Y.

Figure 7:
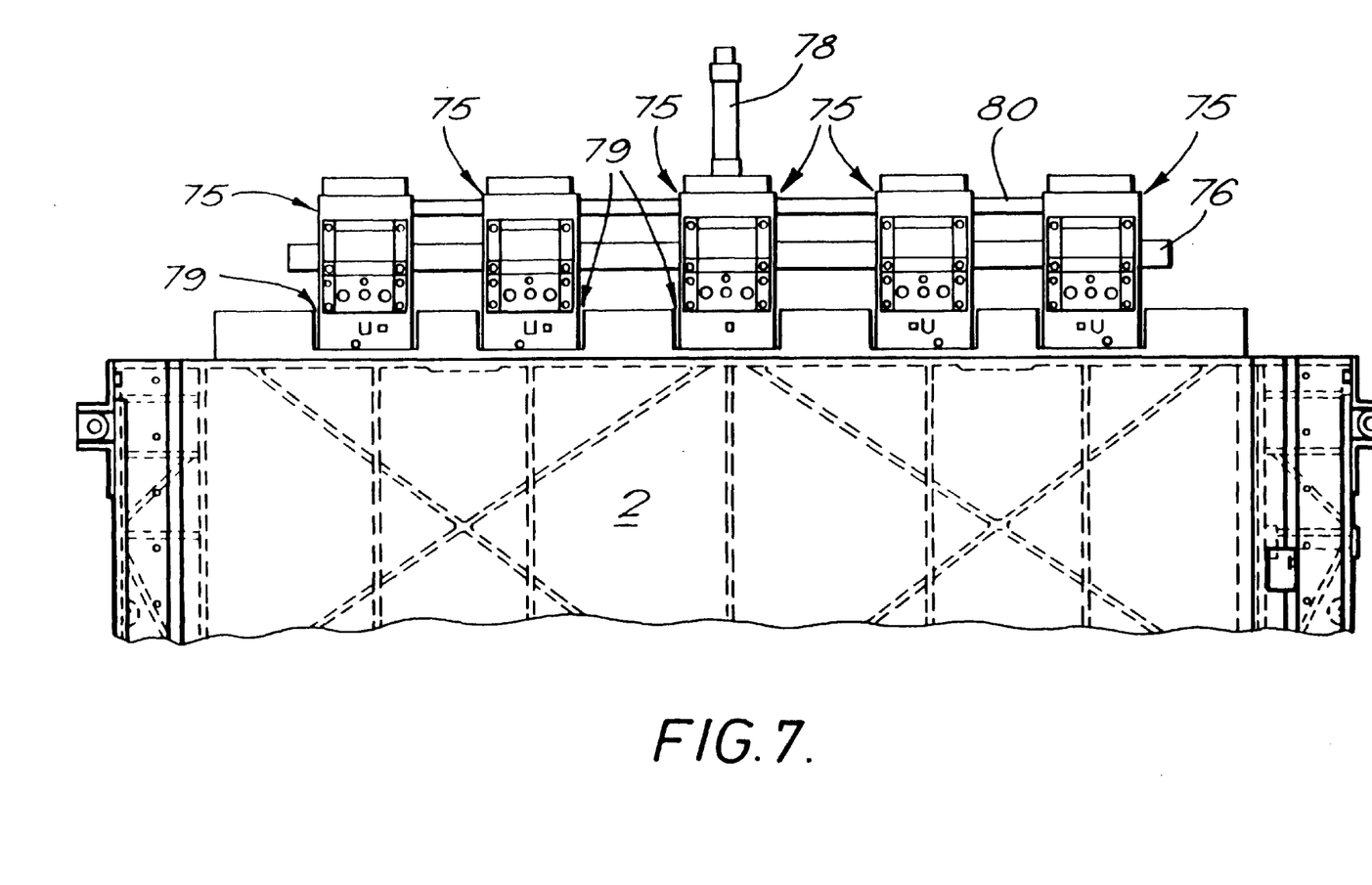
FIG. 7 shows a plan view of the pinch along side C of the platesetter.

A punch set 72 is mounted along side C and moves over the bed to punch registration holes along the adjacent side of the plate 8 after it is gripped by suction on the bed 2 and before it is scanned. The punch set consists of a number of punch units 75 spaced along the side C (five as shown in FIG. 7) and mounted together on a common support member 76 which is guided by slides 77 relative to the bed 2 so as to advance towards and retract from the adjacent edge of the bed under the control of a central fluid actuator 78. The adjacent edge of the bed is provided with a set of notches 79 to receive the punch units 75 when they are advanced towards the bed to punch register holes in a plate 8 which overlies the notches 79. The punch units 75 are opera ed together to punch a sheet through a common cam shaft 80 operated by a fluid actuator 81.

As shown in FIG. 1, the steps 40 that locate the sheet 8 on the bed 2 along side C are located on the bed 2, bit in an alternative embodiment of the invention these stops 40 can be located on the punch units 75 and the punch units engaged with the edge of the bed to receive and locate the sheet 8 when it is loaded onto the bed. The plate 8 is then held in position by suction and the punches punch the register holes. The punch set is then withdrawn from the side of the bed to allow the plate to be scanned.

As an alternative to the scanning of the aluminium plates 8 to form printing images on them, photosensitive film material lay be mounted on the bed and scanned in a similar manner. The film is stored in roll form in a film store 73 along side A of the bed and is force fed out of the bed in direction Y by a feed mechanism in the store. The suction pads 38 on the head 6 may be used to grip the film and move it in the Y direction. A guillotine in the store 73 cuts the film to length, and once located in the final scan position, the film is held by suction applied to the ducts 39 on the bed. The pick-up mechanism 71 then removes the film from the side B once it has been exposed.

It will be appreciated that all of the control functions of the apparatus including the plate and film feed mechanisms, the beam scanning system and the laser beam modulation system, are conveniently all centralised in a processor 74 which incorporates operator controls to set up the apparatus for any particular use.

What is claimed is:

1. Apparatus for scanning a light-beam across a sheet mounted on a flat bed, the apparatus comprising a bridge that extends across the bed from one side to the other and is supported at each end on a carriage guided along a respective one of said sides of the bed, a scanning head that is supported on the bridge and moveable along the length of the bridge so as to scan along a direction perpendicular to the motion of the bridge, drive means at each end of the bridge to drive a respective carriage, location means at each end of the bridge to monitor the position of each carriage along a respective one of said sides, and control means to control operation of each drive means in accordance with information of the position of the respective carriage driven by the drive means, as determined by the respective location means, so that both ends of the bridge are moved simultaneously in relation to one another.

2. Apparatus as claimed in claim 1 in which the drive means comprise electric linear motors.

3. Apparatus as claimed in claim 1 in which the ends of the bridge are pivotally connected to the carriages so as to accommodate slight differential movements of the carriages without impairing the movement of either carriage along said sides.

4. Apparatus as claimed in claim 3 in which the location means takes the form of an optical gratin g along each side and is positioned closely adjacent to these pivotal connections to minimise tilting errors in the carriage position measurements.

5. Apparatus as claimed in claim 4 in which the centre of gravity of the scanning head is aligned with the respective pivotal connections at the ends of the bridge so that acceleration of the scanning head does not apply a torque to the bridge that would adversely effect the positions of the carriages at each end.

6. Apparatus as claimed in claim 1 in which drive means and location means are provided on the bridge to control longitudinal movement of the scanning head along the bridge.

7. Apparatus as claimed in claim 6 in which the drive means comprises an electric linear motor and the location means comprises an optical grating.

8. Apparatus as claimed in claim 1 in which the scanning head preferably scans the light-beam repeatedly across a short distance and is advanced between individual scans so that successive lines are scanned across the direction of advance of the scanning head along the bridge, the light-beam thereby covering a band or swathe in a single traverse across a sheet being scanned.

9. Apparatus as claimed in claim 8 in which successive traverses of the scanning head are offset each by the width of a swathe from the last swathe as the bridge is indexed across the bed so that the whole of the sheet is scanned by the head.

10. An apparatus as claimed in claim 1, in which the location means at each end of the bridge comprises an optical sensor and a grating which move relative to one another, the sensor producing sine and cosine voltage output signals corresponding to the spacing of lines ruled at regular intervals along the grating, the system further comprising a processor that processes these signals to compensate for variations in the distance between the sensor and the grating, the processor serving to determine the instantaneous value of the root of the sum of the squares of the output signals, and divide each of the output signals by this root-mean-square value before processing the output signals to determine the position of the scanning head.

11. An apparatus as claimed in claim 1, further comprising a store for photosensitive plates located beneath the bed, and feed means for feeding photosensitive plates from the store to the bed for scanning.

12. An apparatus as claimed in claim 11 in which the store is such as to store the plates upright in one or more cassettes beneath the bed, and the feed means selects plates as required from the cassettes and feeds each to a feed station along one side of the bed, from where the plate is fed horizontally onto the bed.

13. An apparatus as claimed in claim 12 in which each plate is fed edge first onto the bed with the leading edge generally normal to the feed direction.

14. An apparatus as claimed in claim 13 in which the plates are stored upright in cassettes beneath the bed, and feed means selects plates and feeds them to the feed station.

15. An apparatus as claimed in claim 1, further comprising a plate feed station located along a first side of the bed to feed photosensitive plates one at a time onto the bed in a first feed direction, and a film feed station located along a second side of the bed adjacent said first side to feed photosensitive film sheet onto the bed in a second feed direction transversely of said first feed direction.

16. An apparatus as claimed in claim 15 in which the cassettes are loaded beneath the bed along the same side as the film feed station so that the handling of the photosensitive media takes place in a common work area.

17. An apparatus as claimed in claim 15 in which the plates and film sheet are removed from the bed in said second feed direction so that they can be further handled or processed in the same work area.

18. An apparatus as claimed in claim 1, further comprising sheet location means having air ducts adapted to supply a layer of air to the flat bed on which the sheet can float, and at least one stop member located on the bed in relation to an inclination of the bed from the horizontal so that a sheet floating on the bed slides under the action of gravitational force against the stop.

19. Apparatus as claimed in claim 18 in which stop members are located to support adjacent lowest edges of said sheet so that it is located in mutually orthogonal directions on said bed.

20. An apparatus as claimed in claim 1, further comprising sheet pick up means mounted on the head to contact an upper surface of the sheet and hold it so that it can be moved by the head to be located in position on the bed for subsequent scanning.

21. An apparatus as claimed in claim 1, further comprising location means to position said sheet on said flat bed, holding means to hold said sheet in position on said flat bed, and punch means to punch register holes in said sheet while it is held in position on said flat bed.

22. Apparatus as claimed in claim 21 in which the punch means is moveable relative to the bed so as to advance to punch the sheet and retract to allow scanning of said sheet.

* * * * *